(12) United States Patent
Chen et al.

(10) Patent No.: US 11,069,564 B2
(45) Date of Patent: Jul. 20, 2021

(54) DOUBLE METAL PATTERNING

(71) Applicant: INTERNATIONAL BUSINESS MACHINES CORPORATION, Armonk, NY (US)

(72) Inventors: Hsueh-Chung Chen, Cohoes, NY (US); Yongan Xu, Niskayuna, NY (US); Yann Mignot, Slingerlands, NY (US); James Kelly, Schenectady, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/378,608

(22) Filed: Apr. 9, 2019

(65) Prior Publication Data
US 2020/0328111 A1 Oct. 15, 2020

(51) Int. Cl.
*H01L 21/768* (2006.01)
*H01L 21/033* (2006.01)
*H01L 21/3213* (2006.01)

(52) U.S. Cl.
CPC .... *H01L 21/76841* (2013.01); *H01L 21/0332* (2013.01); *H01L 21/0337* (2013.01); *H01L 21/32136* (2013.01); *H01L 21/7684* (2013.01)

(58) Field of Classification Search
None
See application file for complete search history.

(56) References Cited

U.S. PATENT DOCUMENTS

| | | |
|---|---|---|
| 8,741,763 B2 | 6/2014 | Ma et al. |
| 8,921,225 B2 | 12/2014 | Yuan et al. |
| 9,093,378 B2 | 7/2015 | Kim et al. |
| 9,305,831 B2 | 4/2016 | Ren et al. |
| 9,735,029 B1 | 8/2017 | Chu et al. |
| 9,818,640 B1 | 11/2017 | Stephens et al. |
| 2002/0014645 A1* | 2/2002 | Kobayashi ........ H01L 27/11568 257/296 |
| 2003/0067032 A1* | 4/2003 | Caprara ................ H01L 27/115 257/324 |

(Continued)

FOREIGN PATENT DOCUMENTS

| | | |
|---|---|---|
| CN | 101730928 A | 6/2010 |
| CN | 103299428 A | 9/2013 |

(Continued)

OTHER PUBLICATIONS

Kelly, J. et al., "Experimental study of nanoscale Co damascene BEOL interconnect structures," International Interconnect Technology Conference/Advanced Metallization Conference (IITC/AMC), 2016 pp. 40-42.

(Continued)

*Primary Examiner* — Khaja Ahmad
(74) *Attorney, Agent, or Firm* — Cantor Colburn LLP; L. Jeffrey Kelly

(57) ABSTRACT

A technique relates to a semiconductor device. Mandrels are formed on a substrate, the mandrels including a first metal layer. A second metal layer is formed on the substrate adjacent to the first metal layer, the first and second metal layers being separated by spacer material.

19 Claims, 20 Drawing Sheets

(56) References Cited

U.S. PATENT DOCUMENTS

| | | | |
|---|---|---|---|
| 2008/0171428 A1* | 7/2008 | Kai | H01L 27/11521 |
| | | | 438/587 |
| 2015/0140812 A1 | 5/2015 | Zope et al. | |
| 2016/0314985 A1 | 10/2016 | Yang et al. | |
| 2017/0345841 A1* | 11/2017 | Wu | H01L 29/66545 |
| 2018/0151582 A1* | 5/2018 | Wu | H01L 27/11539 |
| 2019/0067096 A1* | 2/2019 | Huang | H01L 21/0337 |
| 2019/0311902 A1* | 10/2019 | Shin | H01L 21/76897 |
| 2020/0135275 A1* | 4/2020 | Cai | G11C 16/0425 |

FOREIGN PATENT DOCUMENTS

| | | |
|---|---|---|
| CN | 103563086 A | 2/2014 |
| CN | 103839881 A | 6/2014 |
| KR | 20100007152 A | 1/2010 |

OTHER PUBLICATIONS

Chen, J. et al., "Segment removal strategy in SAQP for advanced BEOL application," International Interconnect Technology Conference (IITC), 2017, 3 pages.

International Search Report for Application No. PCT/IB2020/052862 dated Aug. 5, 2020, 9 pages.

\* cited by examiner

ISOMETRIC VIEW

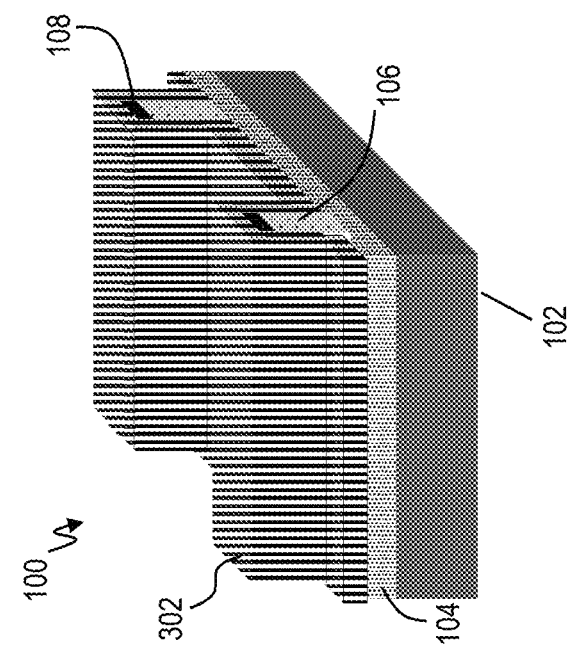

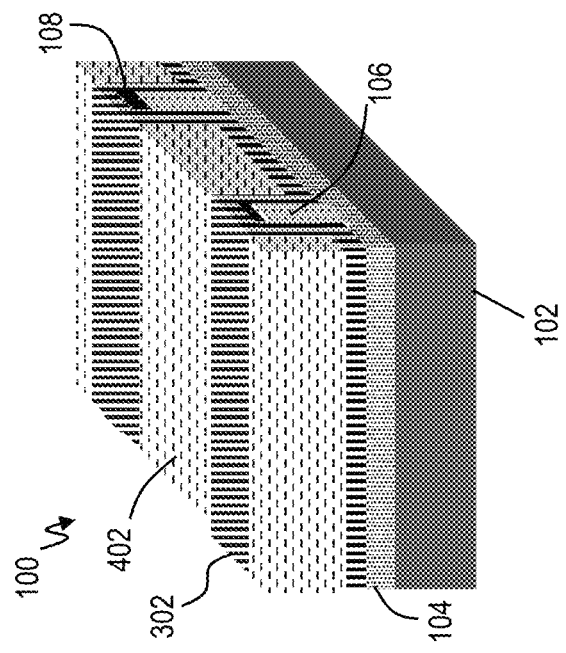

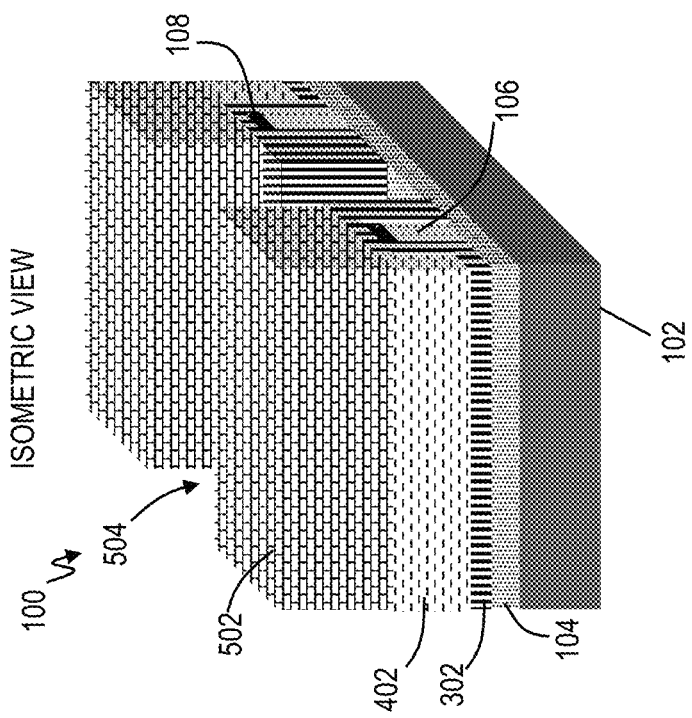

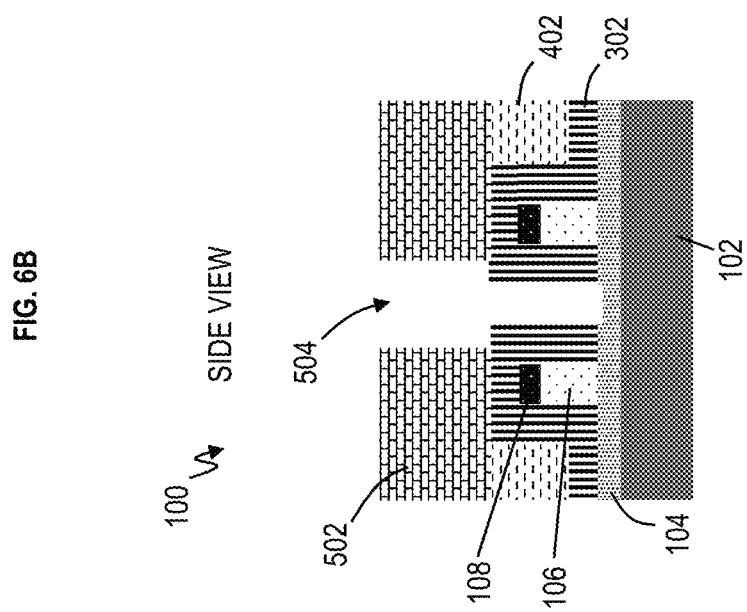

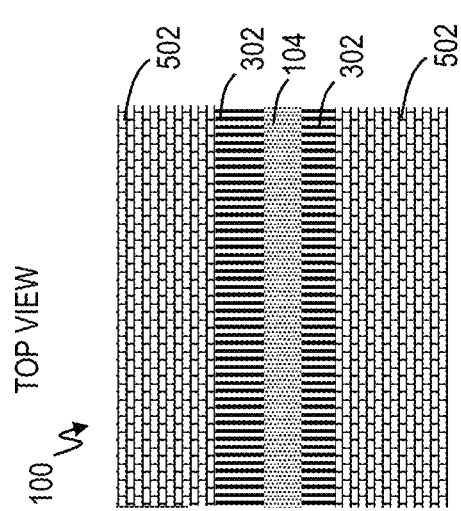

ISOMETRIC VIEW

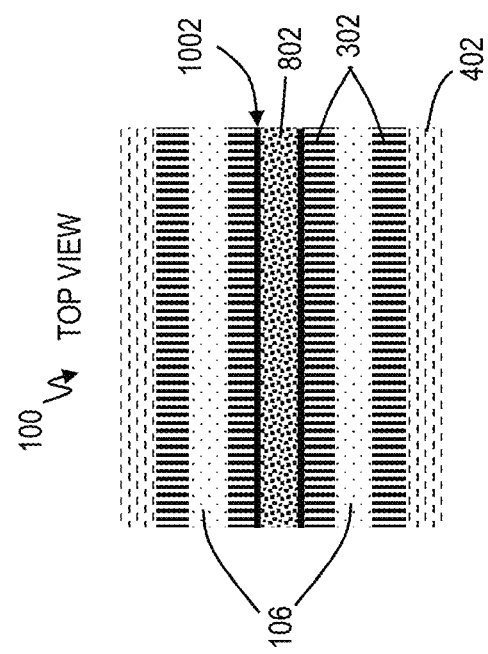

DOUBLE METAL PATTERNING

BACKGROUND

The present invention generally relates to fabrication methods and resulting structures for semiconductor devices, and more specifically, to methods and structures using double metal double patterning for interconnects or wires.

Back-end-of-line (BEOL) is the second portion of integrated circuit (IC) fabrication where individual circuit devices such as transistors, capacitors, resistors, etc., are interconnected with wiring on the wafer. Common metals for the wiring include copper and aluminum. BEOL generally begins when the first layer of metal is deposited on the wafer. BEOL includes contacts, insulating layers (dielectrics), metal levels, and bonding sites for chip-to-package connections. Multiple patterning has been practiced for complementary metal-oxide-semiconductor (CMOS) manufacturing. Among the practical schemes for patterning wires, self-aligned double patterning (SADP) and self-aligned quadruple patterning (SAQP) are used to form wires.

SUMMARY

Embodiments of the invention are directed to a method for forming a semiconductor device. A non-limiting example of the method includes forming mandrels on a substrate, the mandrels including a first metal layer, and forming a second metal layer on the substrate adjacent to the first metal layer, the first and second metal layers being separated by spacer material.

Embodiments of the invention are directed to a semiconductor device. A non-limiting example of the semiconductor device includes mandrels formed on a substrate, the mandrels including a first metal layer, and a second metal layer formed on the substrate adjacent to the first metal layer, the first and second metal layers being separated by spacer material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 depicts an isometric view of the semiconductor device after fabrication operations according to embodiments of the invention;

FIG. 4 depicts an isometric view of the semiconductor device after fabrication operations according to embodiments of the invention;

FIG. 6A depicts an isometric view of the semiconductor device after fabrication operations according to embodiments of the invention;

FIG. 6B depicts a side view of the semiconductor device in FIG. 6A according to embodiments of the invention;

FIG. 6C depicts a top view of the semiconductor device in FIG. 6A according to embodiments of the invention;

FIG. 11C depicts a top view of the semiconductor device in FIG. 11A according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as the size of devices such as transistor, capacitors, etc., on integrated circuits become smaller, the scaling of interconnect pitch is becoming more difficult. The SADP process can be used to form interconnects but it requires many complicated steps.

Turning now to an overview of the aspects of the invention, one or more embodiments of the invention provide semiconductor devices and methods which use double metal double patterning (DMDP). According to embodiments of the invention, DMDP provides metal resistance control by allowing use of alternative metals, such as cobalt, ruthenium, nickel, etc., and employs an integration scheme that utilizes 50% fewer process operations than the state-of-the-art the self-aligned double patterning (SADP) scheme. For example, DMDP can pattern two different metals with less process steps and less etching steps than the state-of-the-art SADP because one of the metals serves the function of a mandrel and remains on the semiconductor device according to embodiments of the invention. Therefore, the fabrication processes of forming sacrificial mandrels and later removing the sacrificial mandrels are not required for embodiments of the invention.

Figure 1:
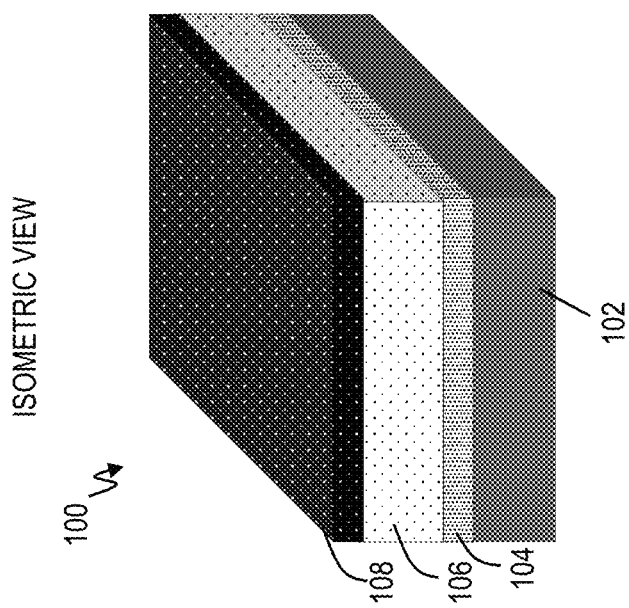
FIG. 1 depicts an isometric view of a semiconductor device after an initial set of fabrication operations according to embodiments of the invention.

Turning now to a more detailed description of aspects of the present invention, FIG. 1 depicts an isometric view of a semiconductor device 100 according to embodiments of the invention. After initial fabrication operations, the semiconductor device 100 includes a layer 104 formed on a substrate 102. The substrate 102 is formed of semiconductor material. The substrate 102 can be a silicon (Si), silicon germanium, III-V materials, etc., although other materials can be used. The layer 104 can include dielectric materials such as oxide materials, nitride materials, etc. A first metal layer 106 is formed on the prior level/layer 104. In one or more embodiments of the invention, the prior level/layer 104 might be omitted and the first metal layer 106 can be formed on the substrate 102. Example materials of the first metal layer 106 can include alternative metals such as cobalt, ruthenium, nickel, tungsten, platinum, etc. Other example materials of the first metal layer 106 can include tungsten, copper, aluminum, gold, silver, etc. A hard mask layer 108 is formed on the first metal layer 106. The hard mask layer 108 can include oxide materials and nitride materials. Standard lithography techniques can be implemented in the fabrication process of the semiconductor device 100.

Figure 2:
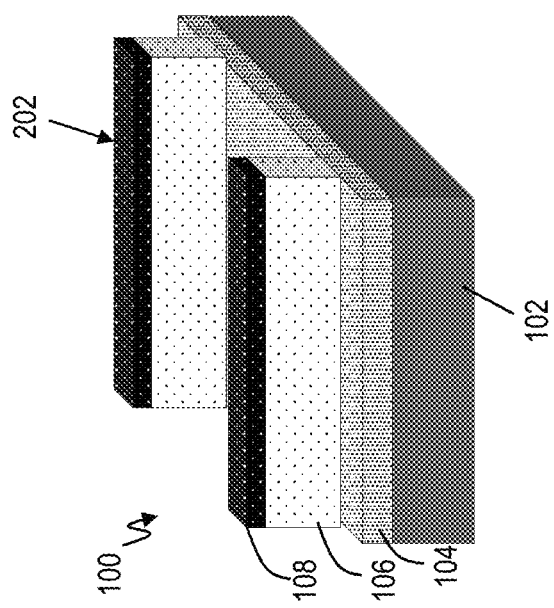
FIG. 2 depicts an isometric view of the semiconductor device after fabrication operations according to embodiments of the invention.

FIG. 2 depicts an isometric view of the semiconductor device 100 according to embodiments of the invention. Mandrel patterning is performed. Etching can be performed to pattern the hard mask layer 108, and the pattern of the hard mask layer 108 is etched into the first metal layer 106, thereby forming mandrels 202. Reactive ion etching (ME) or other etching can be used to form the mandrels 202. The first metal layer 106 itself becomes the mandrels 202 without having to separately form mandrels from non-metal materials. Additionally, the mandrels 202 which are the patterned material of the first metal layer 106 remain (i.e., are not etched away) and become metal wires that are used as interconnects. Main etch chemistries are $Cl_2/BCl_2$ for aluminum, ruthenium, titanium and $SF_6$ for tungsten, for example.

FIG. 3 depicts an isometric view of the semiconductor device 100 according to embodiments of the invention. A spacer material 302 is formed on the semiconductor device 100. The spacer material 302 can be deposited using various deposition techniques including atomic layer deposition, spin-on dielectrics, etc. The spacer material 302 can include dielectric materials such as oxide materials and nitride materials. Also, example materials of the spacer material 302 can include carbon-based materials such as graphene, carbon nanotubes, and fullerenes which can be referred to as nanocarbons. Other carbon-based materials can include silicon boron carbide nitride (SiBCN), silicon oxycarbide (SiOC), silicon carbon nitride (SiCN), silicon oxygen carbon nitride (SiOCN), etc. Carbon material is chosen to provide enough etch selectivity for the downstream process when it will be etched over layer 104 in FIGS. 6A, 6B, and 6C. Further, the spacer material 302 has sufficient thickness such that the spacer material 302 provides physical and electrical separation between adjacent metal wires, as discussed further below.

FIG. 4 depicts an isometric view of the semiconductor device 100 according to embodiments of the invention. Backfill deposition and etch back are performed. For example, a fill material 402 is deposited and etch back is performed stopping on the spacer material 302. The fill material 402 can be formed as spin-on-glass (SOG), which is an interlayer dielectric material applied in liquid form to fill narrow gaps and thus conducive to planarization.

Figure 5A:
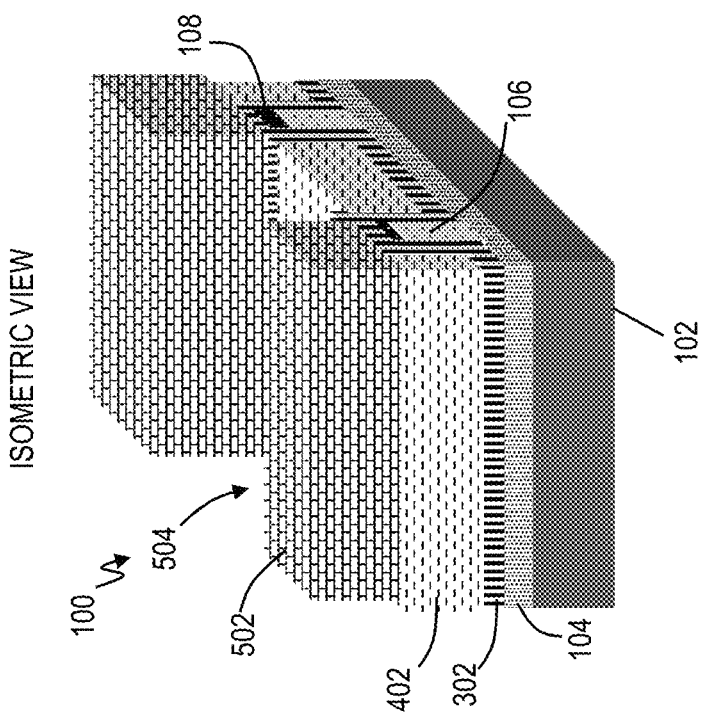
FIG. 5A depicts an isometric view of the semiconductor device after fabrication operations according to embodiments of the invention.
Figure 5B:
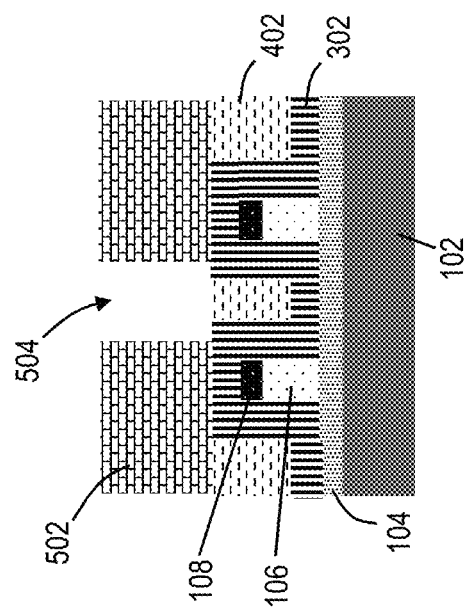
FIG. 5B depicts a side view of the semiconductor device in FIG. 5A according to embodiments of the invention.
Figure 5C:
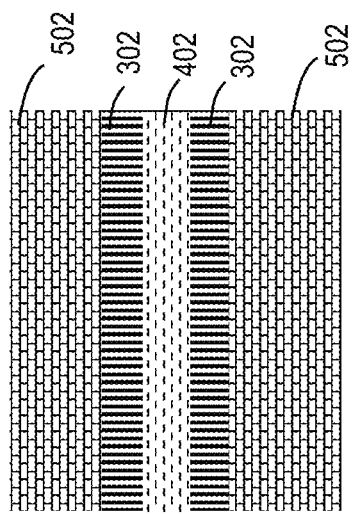
FIG. 5C depicts a top view of the semiconductor device in FIG. 5A according to embodiments of the invention.

FIG. 5A depicts an isometric view of the semiconductor device 100 according to embodiments of the invention. FIG. 5B depicts a side view of the semiconductor device 100 in FIG. 5A according to embodiments of the invention. FIG. 5C depicts a top view of the semiconductor device 100 in FIG. 5A according to embodiments of the invention. Non-mandrel lithography is performed. In the state-of-the-art, sacrificial mandrels are used as placeholders to form subsequent features having a desired shape, and the sacrificial mandrels are then removed. Embodiments of the invention do not require removal of the mandrels 202 in which the patterned first metal layer 106 is and/or functions as the mandrel. Accordingly, embodiments of the invention employ a non-mandrel process because the mandrels 202 are not the sacrificial mandrels used in the state-of-the-art. A block mask 502 is deposited and patterned using standard lithography. The block mask 502 can include an organic planarization layer (OPL). Optionally, the block mask 502 can include an anti-reflective coating (ARC) layer formed on the OPL layer. A trench 504 is formed in the block mask 502. The trench 504 exposes a portion of the fill material 402 and spacer material 302. In some examples, the top surfaces of the spacer material 302 might not be exposed in the trench 504. The trench 504 is formed in preparation to deposit metal for metal wires. It is noted that in the conventional SADP integration, non-mandrel area is always a dependent upon having the conventional sacrificial mandrel present. There is no need and no way to perform the non-mandrel lithography discussed in embodiments of the invention, because there is nothing in the non-mandrel area in the state-of-the-art. However, in this DMDP integration according to embodiments of the invention, non-mandrel lithography is possible because of the back fill material 402 in the non-mandrel area. This enables the ability to define the shape of non-mandrel features, which include the features other than the patterned material of the first metal layer 106, because the patterned first metal layer 106 is or acts as the mandrel.

FIG. 6A depicts an isometric view of the semiconductor device 100 according to embodiments of the invention. FIG. 6B depicts a side view of the semiconductor device 100 in FIG. 6A according to embodiments of the invention. FIG. 6C depicts a top view of the semiconductor device 100 in FIG. 6A according to embodiments of the invention. Spacer etch is performed to etch the exposed fill material 402 and the spacer material 302 immediately under the removed backfill material 402. Reactive ion etching (ME) can be performed. As mentioned above, the spacer material 302 is a carbon-based material which gives it an etch selective to the back fill material 304, an SOG material. In addition, the non-mandrel feature size (CD) (i.e., the location where a second metal layer 802 will be formed in FIGS. 8A and 8B after removing the exposed backfill material 402) is expected to be defined by the spacer material 302, particularly the previous location of the removed backfill material 402 exposing the layer 104 between the spacer material 302. As a result, the back fill material 402 is designated to be etched away in preparation for deposition of the second metal layer 802.

Figure 7:
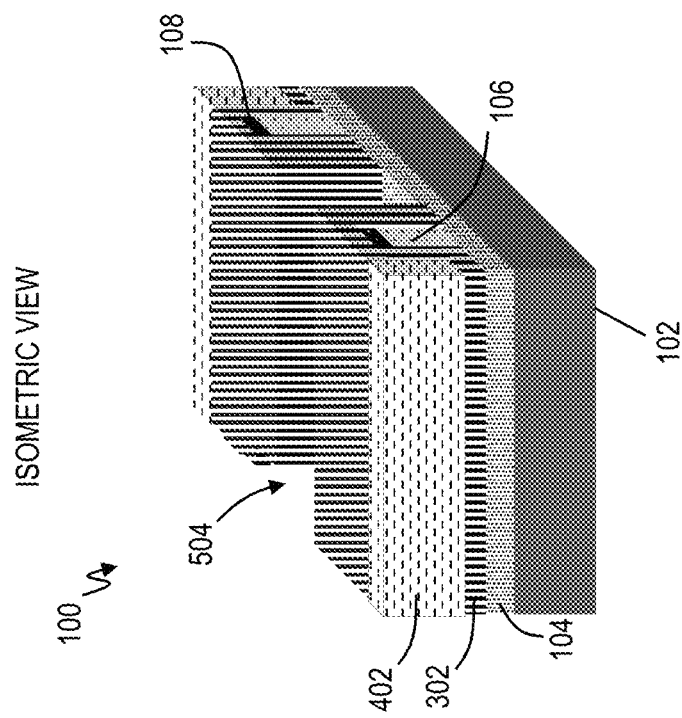
FIG. 7 depicts an isometric view of the semiconductor device after fabrication operations according to embodiments of the invention.

FIG. 7 depicts an isometric view of the semiconductor device 100 according to embodiments of the invention. The block mask 502 is removed. For example, the OPL layer can be stripped using a plasma stripping process. Removing the OPL concurrently removes the ARC layer on top.

Figure 8A:
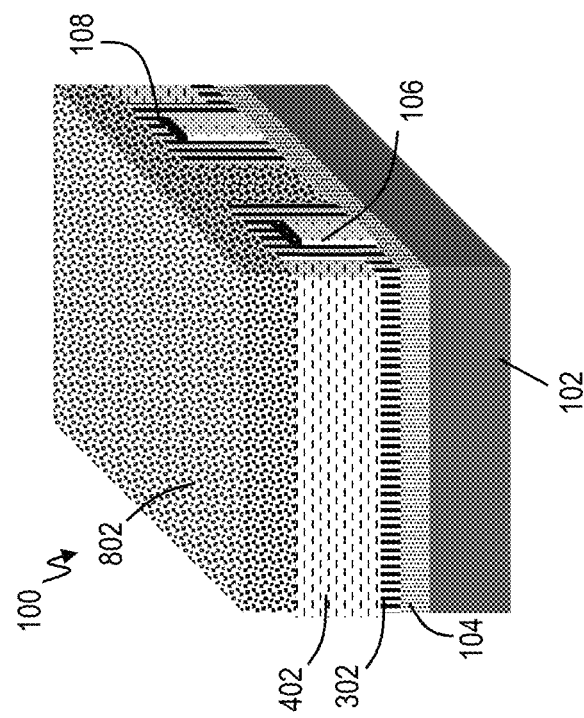
FIG. 8A depicts an isometric view of the semiconductor device after fabrication operations according to embodiments of the invention.
Figure 8B:
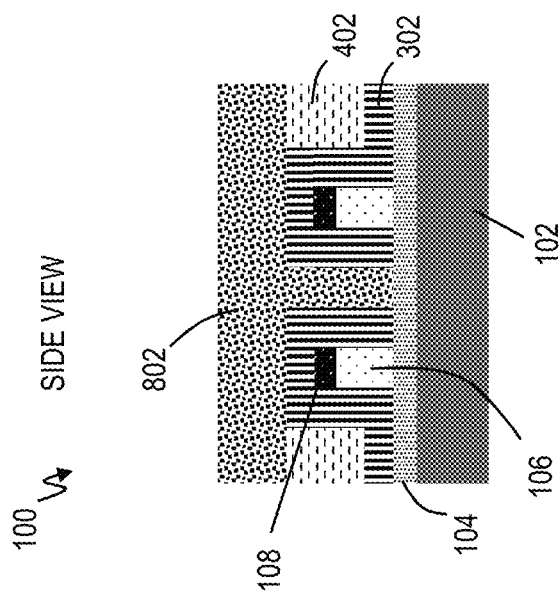
FIG. 8B depicts a side view of the semiconductor device in FIG. 8A according to embodiments of the invention.

FIG. 8A depicts an isometric view of the semiconductor device 100 according to embodiments of the invention. FIG. 8B depicts a side views of the semiconductor device 100 in FIG. 8A according to embodiments of the invention. Second metal deposition is performed. A second metal layer 802 is deposited on the semiconductor device 100 using standard lithography techniques. More particularly, the second metal layer 802 is formed in the previous location of the removed backfill material 402. As previously seen in FIGS. 6A and 6B, the trench 504 has an extended depth after removal of the backfill material 402.

Example materials of the second metal layer 802 can include alternative metals such as cobalt, ruthenium, nickel, tungsten, platinum, etc. Other example materials of the second metal layer 802 can include copper, aluminum, gold, silver, etc. It is noted that the first metal layer 106 and the second metal layer 802 can be different materials, which correspondingly forms double metal wire lines with different materials. In this way, one wire can have different properties from another metal wire because the metal wires can be formed of different materials. In some examples, it is contemplated that the first metal layer 106 and the second metal layer 802 can be the same materials. It is noted that the first metal layer 106 having been patterned into mandrels remains to become one of the double metal wires, and therefore, the fabrication processes of forming and subsequently removing sacrificial mandrels are omitted.

Figure 9A:
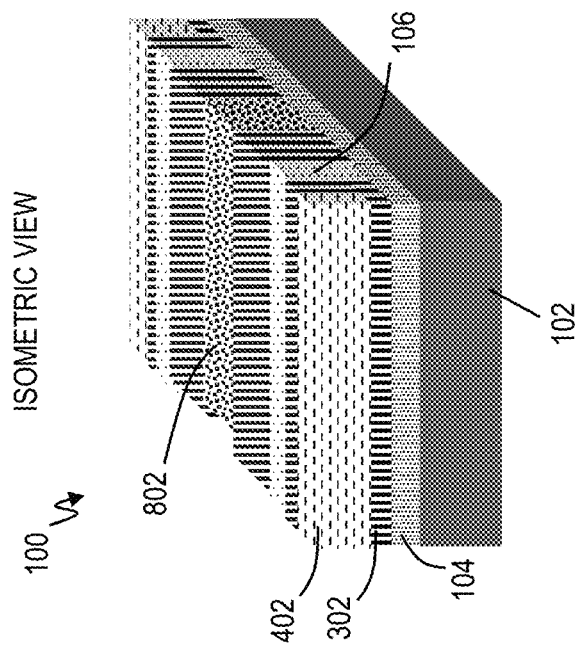
FIG. 9A depicts an isometric view of the semiconductor device after fabrication operations according to embodiments of the invention.
Figure 9B:
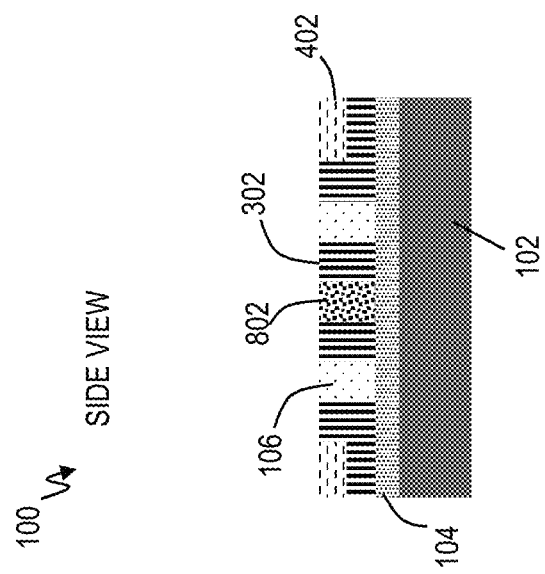
FIG. 9B depicts a side view of the semiconductor device in FIG. 9A according to embodiments of the invention.
Figure 9C:
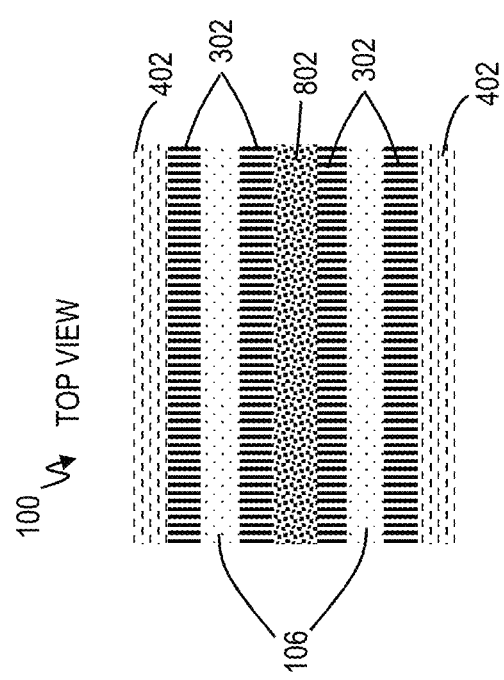
FIG. 9C depicts a top view of the semiconductor device in FIG. 9A according to embodiments of the invention.

FIG. 9A depicts an isometric view of the semiconductor device 100 according to embodiments of the invention. FIG. 9B depicts a side view of the semiconductor device 100 in FIG. 9A according to embodiments of the invention. FIG. 9C depicts a top view of the semiconductor device 100 in FIG. 9A according to embodiments of the invention. Chemical mechanical planarization/polishing (CMP) is performed on the second metal layer 802 to remove excess portions of the second metal layer 802, portions of space material 302, and hard mask layer 108. The CMP stops on the first metal layer 106. As noted above, the CMP also removes the hard mask layer 108 on top of the first metal layer 106, and therefore, the tops of the first metal layer 106 and second metal layer 802 are exposed. The first metal layer 106 and second metal layer 802 are metal wires, which are also referred to as interconnects.

Figure 10:
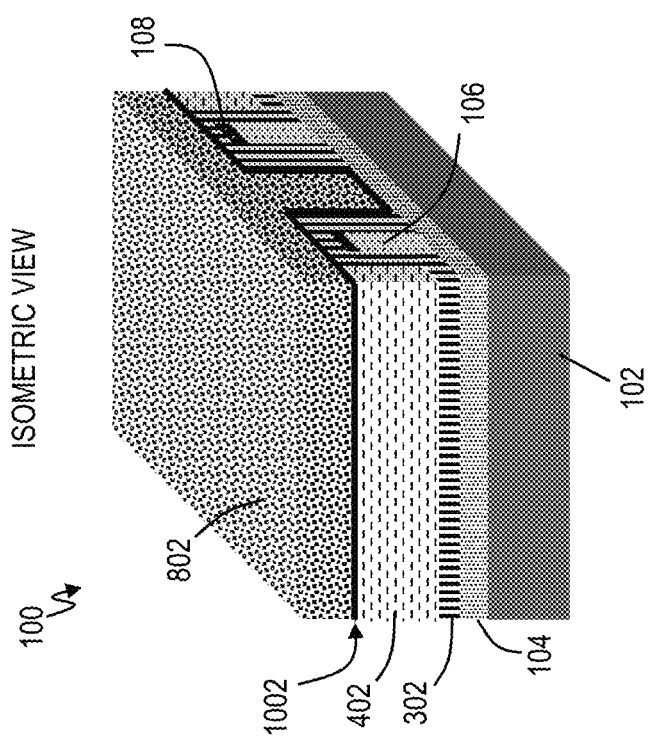
FIG. 10 depicts an isometric view of the semiconductor device after fabrication operations according to embodiments of the invention.

The width of each of the metal wires, for first metal layer 106 and second metal layer 802 in the side view, is less than about 40 nanometers (nm). By having line widths less than 40 nm, the first metal wire layer 106 and the second metal wire layer 802 can have different wire resistances when the first metal wire layer 106 and second metal wire layer 802 are two different metals. The line widths of first metal wires/first metal wire layers 106 and second metal wire/second metal wire layer 802 are best seen in the side view. It should be appreciated that although 3 metal wires are illustrated, the semiconductor device 100 is not limited to 3 metal wires and can have numerous metal wires to make connections to individual circuit devices such as transistors, capacitors, resistors, etc., as understood by one skilled in the art As an option of depositing a liner, FIG. 10 depicts an isometric view of the semiconductor device 100 according to embodiments of the invention. FIG. 10 continues from the fabrication operations in FIG. 7. A liner 1002 can be deposited on the top surface of the semiconductor device 100. A conformal deposition technique can be used. The second metal layer 802 is now deposited on top of the liner 1002 using standard lithography techniques. Examples materials of the second metal layer 802 are noted above. The liner 1002 could be or acts as an adhesion layer, a diffusion layer, etc. The material of the optional liner 1002 can be different according to the material of the second metal layer 802. For example, in a case where the second metal layer 802 is copper, the liner 1002 can be TiN, TaN, etc. In a case where the second metal layer 802 is aluminum, the liner 1002 can be TiN, Ta, etc. In a case where the second metal layer 802 is cobalt, the liner 1002 can be TiN. In a case where the second metal layer 802 is ruthenium, no liner 1002 is utilized.

Figure 11A:
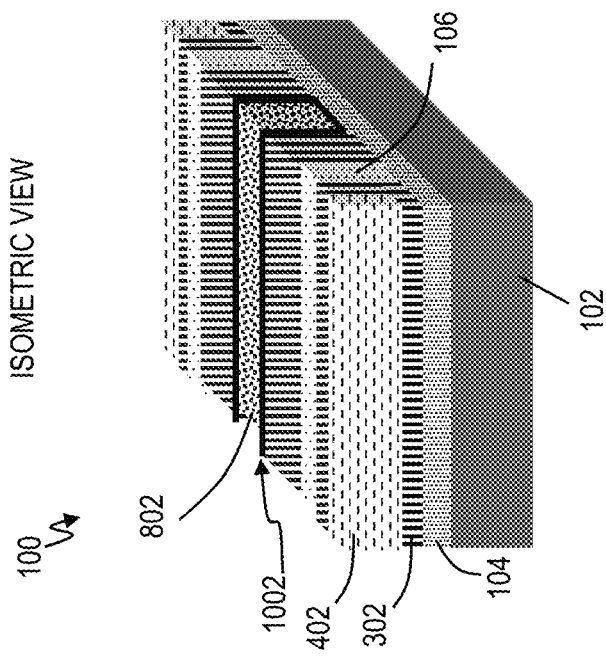
FIG. 11A depicts an isometric view of the semiconductor device after fabrication operations according to embodiments of the invention.
Figure 11B:
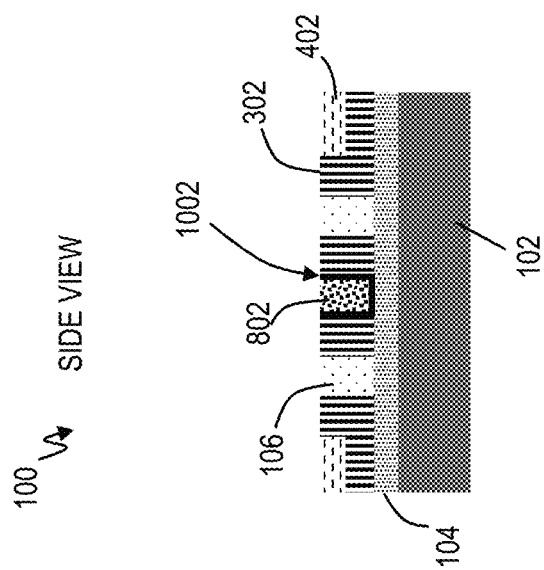
FIG. 11B depicts a side view of the semiconductor device in FIG. 11A according to embodiments of the invention.

FIG. 11A depicts an isometric view of the semiconductor device 100 according to embodiments of the invention. FIG. 11B depicts a side view of the semiconductor device 100 in FIG. 11A according to embodiments of the invention. FIG. 11C depicts a top view of the semiconductor device 100 in FIG. 11A according to embodiments of the invention. As noted in FIGS. 9A, 9B, and 9C, CMP is performed on the second metal layer 802. CMP stops on the first metal layer 106. CMP also removes the hard mask layer 108 on top of the first metal layer 106 and removes portions of liner 1002. Accordingly, the tops of the first metal layer 106 and second metal layer 802 are exposed. The first metal layer 106 and second metal layer 802 are metal wires, which are also referred to as interconnects.

A method of forming a semiconductor device 100 is provided according to embodiments of the invention. Mandrels 202 are formed on a substrate 102, the mandrels 202 including a first metal layer 106. A second metal layer 802 is formed on the substrate 102 adjacent to the first metal layer 106, the first and second metal layers being separated by spacer material 302.

A dielectric layer (e.g., layer 104) is formed as an intervening layer between the substrate 102 and the mandrels 202. A dielectric layer (e.g., layer 104) is an intervening layer formed between the substrate 102 and the second metal layer 802. The spacer material 302 is formed on sides of the mandrels 202.

Forming the second metal layer 802 on the substrate 102 adjacent to the first metal layer 106 includes: forming the spacer material 302 on the mandrels, forming fill material 402 on the spacer material 302, forming a trench 504 or pattern through the fill material 402 and the spacer material 302, and forming the second metal layer 802 in the trench 504 or pattern.

The first metal layer 106 includes different material from the second metal layer 802. The first metal layer 106 and the second metal layer 802 include the same material. The first metal layer is a metal wire, and the second metal layer is a metal wire. A liner layer/liner 1002 is an intervening layer formed between the second metal layer 802 and the spacer material 302. A liner layer/liner 1002 is an intervening layer formed between the second metal layer 802 and the substrate 102.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of threedimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming mandrels on a substrate, the mandrels comprising a first metal layer; and
   disposing spacer material and fill material on the mandrels so as to form a pattern having a trench between portions of the first metal layer by entirely removing the fill material between two adjacent mandrels, the trench exposing a dielectric layer in direct contact with the substrate, the spacer material covering a top surface and sidewalls of the first metal layer; and
   forming a second metal layer on the dielectric layer in direct contact with the substrate in the pattern so as to fill the trench between the portions of the first metal layer, the second metal layer being adjacent to the first metal layer, the first and second metal layers being separated by the spacer material.

2. The method of claim 1, wherein a dielectric layer is an intervening layer formed between the substrate and the mandrels.

3. The method of claim 1, wherein the dielectric layer is an intervening layer formed between the substrate and the second metal layer.

4. The method of claim 1, wherein the spacer material is formed on sides of the mandrels.

5. A method of forming a semiconductor device, the method comprising:
   forming mandrels on a substrate, the mandrels comprising a first metal layer; and
   forming a second metal layer on the substrate adjacent to the first metal layer, the first and second metal layers being separated by spacer material, wherein forming the second metal layer on the substrate adjacent to the first metal layer comprises:
   forming the spacer material on the mandrels;
   forming fill material on the spacer material;
   forming a pattern through the fill material and the spacer material by entirely removing the fill material between two adjacent mandrels; and
   forming the second metal layer in the pattern.

6. The method of claim 1, wherein the first metal layer comprises a different material from the second metal layer.

7. The method of claim 1, wherein the first metal layer and the second metal layer comprise a same material.

8. The method of claim 1, wherein the first metal layer comprises a metal wire.

9. The method of claim 1, wherein the second metal layer comprises a metal wire.

10. The method of claim 1, wherein a liner layer is an intervening layer formed between the second metal layer and the spacer material.

11. The method of claim 1, wherein a liner layer is an intervening layer formed between the second metal layer and the substrate.

12. A semiconductor device comprising:
    mandrels formed on a substrate, the mandrels comprising a first metal layer;
    spacer material formed in a pattern having a trench between portions of the first metal layer, the trench exposing a dielectric layer in direct contact with the substrate by entirely removing a fill material between two adjacent mandrels, the spacer material covering a top surface and sidewalls of the first metal layer; and
    a second metal layer formed on the dielectric layer in direct contact with the substrate adjacent to the first metal layer pattern so as to fill the trench between the portions of the first metal layer, the first and second metal layers being separated by the spacer material, wherein vertical sidewalls of the spacer material are adjacent to the second metal layer while elbow shaped sidewalls of the spacer material are adjacent to the first metal layer, an inner part of the elbow shaped sidewalls comprising the fill material.

13. The semiconductor device of claim 12, wherein a dielectric layer is an intervening layer formed between the substrate and the second metal layer.

14. The semiconductor device of claim 12, wherein the spacer material is formed on sides of the mandrels.

15. The semiconductor device of claim 12, wherein the first metal layer comprises a different material from the second metal layer.

16. The semiconductor device of claim 12, wherein the first metal layer and the second metal layer comprise a same material.

17. The semiconductor device of claim 12, wherein the first metal layer comprises a metal wire and the second metal layer comprises another metal wire.

18. The semiconductor device of claim 12, wherein a liner layer is an intervening layer formed between the second metal layer and the spacer material.

19. The semiconductor device of claim 12, wherein a liner layer is an intervening layer formed between the second metal layer and the substrate.

* * * * *